United States Patent [19]

Onishi et al.

[11] 4,340,975
[45] Jul. 20, 1982

[54] MICROWAVE MIXING CIRCUIT AND A VHF-UHF TUNER HAVING THE MIXING CIRCUIT

[75] Inventors: Hiroshi Onishi, Kawasaki; Sadahiko Yamashita, Sagamihara, both of Japan

[73] Assignee: Matsushita Electric Industrial Company, Limited, Osaka, Japan

[21] Appl. No.: 195,314

[22] Filed: Oct. 8, 1980

[30] Foreign Application Priority Data

Oct. 9, 1979 [JP] Japan .............................. 54-130573
Apr. 14, 1980 [JP] Japan .............................. 55-49377

[51] Int. Cl.³ ..................... H03D 7/02; H03D 7/14; H04B 1/26; H04N 5/44
[52] U.S. Cl. .................. 455/315; 358/191.1; 455/327; 455/330; 455/331
[58] Field of Search ............ 455/315, 316, 318, 319, 455/320, 323, 325, 326, 327, 330, 331; 358/191.1

[56] References Cited

U.S. PATENT DOCUMENTS

| | | | |
|---|---|---|---|
| 3,801,915 | 4/1974 | Ostuni | 455/316 |
| 3,823,380 | 7/1974 | Young | 455/325 |
| 3,939,429 | 2/1976 | Löhn | 455/315 |
| 4,061,990 | 12/1977 | Ueno | 455/325 |
| 4,152,669 | 5/1979 | Igarashi | 455/316 |
| 4,249,263 | 2/1981 | Shinkawa | 455/330 |

*Primary Examiner*—Howard Britton
*Attorney, Agent, or Firm*—Lowe, King, Price & Becker

[57] ABSTRACT

In a double superheterodyne tuner for receiving TV channel signals, a frequency in a range defined between 2520 and 2700 MHz is selected as the first intermediate frequency, while the first intermediate frequency is obtained by subtracting a desired channel frequency from a first local oscillator frequency. The tuner comprises first and second mixing circuits respectively used for effecting frequency conversion, where each of these mixing circuits has parallel coupled lines so that each mixing circuit operates as a balance-to-unbalance transformer. The second mixing circuit further comprises a short-circuit line placed between the parallel coupled lines. The tuner also comprises a band pass filter having a band width less than 5 MHz, which selectively transmits the first intermediate frequency signal from the first mixing circuit.

29 Claims, 21 Drawing Figures

MICROWAVE MIXING CIRCUIT AND A VHF-UHF TUNER HAVING THE MIXING CIRCUIT

FIELD OF THE INVENTION

The present invention relates generally to a tuner for selectively receiving a desired channel signal among a plurality of received TV signals, and particularly, the present invention relates to VHF-UHF all-channel tuner of double superheterodyne type.

BACKGROUND OF THE INVENTION

In order to receive both VHF and UHF TV broadcast signals it has been required to utilize two independent tuners hitherto, where these two tuners have to be switched from one to another. However, recently, an all-channel electronic tuner of double superheterodyne type has been proposed so that all channel signals can be simply selected without switching from one tuner to another. As will be described with reference to the accompanying drawings, such an electronic all-channel tuner has a disadvantage that spurious signals would occur due to harmonics of a local oscillator output signal.

In a tuner of the superheterodyne or double superheterodyne type, mixer or mixers, which convert the frequency of an incoming signal into a desired intermediate frequency, play an important role where the characteristics of mixer(s) have to meet various requirements. Although there are many known compact mixers, in these conventional mixers, image frequency components as well as the harmonic components of the local oscillator frequency are not positively processed or treated. As a result, conventional mixers have to suffer conversion loss of 6 to 10 dB.

SUMMARY OF THE INVENTION

The present invention has been developed in order to remove the above-mentioned disadvantages and drawbacks inherent in the conventional tuners and mixers.

It is, therefore, a primary object of the present invention to provide a new and useful VHF-UHF all-band tuner for receiving TV broadcast signals, in which spurious signal interference caused by channel signals other than a desired channel signal is suppressed to the utmost.

Another object of the present invention is to provide a VHF-UHF all-band tuner for receiving TV broadcast signals, having low-noise and low-distortion characteristics.

A further object of the present invention is to provide a mixing circuit for a VHF-UHF all-band tuner, in which the conversion loss is remarkably improved.

A still further object of the present invention is to provide a single-balanced mixing circuit for a VHF-UHF all-band tuner, in which the sum components of the local oscillator frequency and the incoming signal frequency, as well as the second harmonic component of the local oscillator frequency is suppressed by means of an original balance-to-unbalance transformer formed in a microwave integrated circuit.

BRIEF DESCRIPTION OF THE DRAWINGS

These and other objects and features of the present invention will be more readily apparent from the following detailed description of the preferred embodiments taken in conjunction with the accompanying drawings in which.

DETAILED DESCRIPTION OF THE PREFERRED EMBODIMENTS

Prior to describing the preferred embodiments of the present invention, conventional tuners and mixing circuits used in tuners will be discussed for a better understanding of the objects of the present invention.

Figure 1:
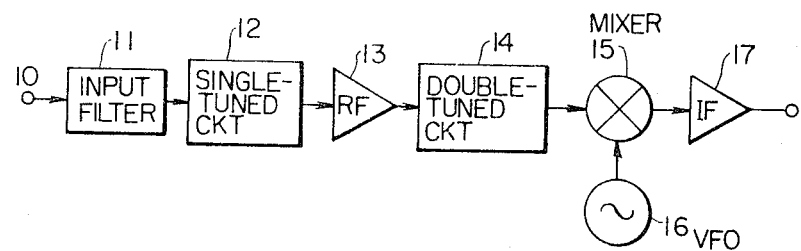
FIG. 1 is a block diagram of a conventional VHF electronic tuner.

FIG. 1 illustrates a block diagram of a VHF electronic tuner which has been used up to this time. An incoming or received signal is applied to an input filter 11 from a input terminal 10 so that interference signal in the intermediate frequency range, FM signals and the like which may interfere the TV intermediate frequency signal are eliminated from the incoming signal to be applied to a single-tuned circuit 12. In the single-tuned circuit 12, a desired channel is selected by means of a variable resonance element constructed of a varactor (not shown), and then the selected channel signal is applied to a radio frequency (RF) amplifier 13 to be amplified. The amplified signal is applied to a double-tuned circuit 14, in which two varactors (not shown) are used as variable resonance elements so that undesired signals are eliminated. The output signal of the double-tuned circuit 14 is then applied to an input terminal of a mixing circuit 15 which is also responsive to an oscillating signal from a variable frequency oscillator 16 having a varactor (not shown). Thus, the output signal of the double-tuned circuit 14 is converted to an intermediate frequency (IF) signal in the mixing circuit 15, and this IF signal is applied to an intermediate frequency (IF) amplifier 17 to be amplified therein.

In the above-described conventional tuning circuit, one or more varactors are required in each of the above-mentioned single-tuned circuit 12, double-tuned circuit 14 and the variable frequency oscillator 16, and tracking adjustment between the respective circuits is necessary. Furthermore, in order to receive both VHF and UHF signals two independent tuning circuits are required. In addition, it is necessary to change the tuning frequency and oscillating frequency by means of a switching diode to receive both a lower frequency band and a higher frequency band in VHF range.

Recently, an all-channel tuner of the double superheterodyne type has been proposed in order to remove the above-mentioned disadvantages and drawbacks inherent to the conventional electronic VHF-UHF tuner. There are two types in the already proposed double super-heterodyne tuners as follows: The first type is that the first intermediate frequency of $f_{IF1}$ equals the difference between the local oscillator frequency $f_{L1}$ and the incoming or received signal frequency $f_R$, namely $f_{L1} - f_R = f_{IF1}$, where $f_{IF1}$ is selected between 300 and 400 MHz. The second type is that the first intermediate frequency $f_{IF1}$ equals the sum of the local oscillator frequency $f_{L1}$ and the incoming signal frequency $f_R$, namely, $f_{L1} + f_R = f_{IF1}$, where $f_{IF1}$ is 3000 MHz. Both of these types have drawbacks as will be described in detail with reference to FIG. 2 and FIG. 3 hereinbelow.

Figure 2:
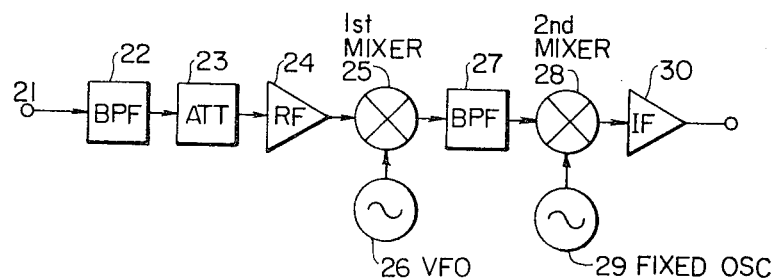
FIG. 2 is a schematic block diagram showing the fundamental structure of a double superheterodyne all-band tuner.

FIG. 2 shows a basic structure of an all-band tuner of the double superheterodyne type. In FIG. 2, a reference numeral 21 designates an input terminal connected to a fixed band pass filter 22 having a necessary range, such as VHF and UHF. A reference numeral 23 designates a variable attenuator which follows the band pass filter 22, and the output terminal of the variable attenuator 23 is connected to an input terminal of an RF amplifier 24 the output terminal of which is connected to a first input terminal of a first mixing circuit 25. With this arrangement, a high frequency incoming or received signal applied to the input terminal 21 is filtered, attenuated, and then amplified to be applied to the first mixing circuit 25. The first mixing circuit 25 receives via its second input terminal a local oscillator signal from a variable frequency oscillator 26 so that the local oscillator frequency is mixed with the incoming high frequency applied via the first input terminal of the mixing circuit 25. As a result, the incoming high frequency signal corresponding to a desired TV channel is converted into a first intermediate frequency. The output terminal of the first mixing circuit 25 is connected to an input terminal of a second band pass filter whose filtering frequency is fixed, so that signals in the vicinity of the first intermediate frequency are selectively transmitted to the following circuits to reduce interference due to signals of other channels. The output terminal of the second band pass filter 27 is connected to a first input terminal of a second mixing circuit 28 which also receives via its second input terminal a local oscillator signal from a fixed oscillator 29. The first intermediate frequency applied to the first input terminal of the second mixing circuit 28 is, therefore, converted into a second intermediate frequency which corresponds to the intermediate frequency of a TV set. An intermediate frequency amplifier 30 follows the second mixing circuit 28 for amplifying the second intermediate frequency.

In the above-described basic structure of the tuner, characteristics of respective circuits are very important when determining the total characteristic of the tuner, while the interference-rejection characteristics of the tuner is greatly affected by the value of the first intermediate frequency.

Suppose the first intermediate frequency is set to a frequency, for instance, of 330 MHz, in a range between 300 and 400 MHz, and the aforementioned first mixing method or type is adopted. Namely, the first intermediate frequency $f_{IF1}$ is obtained by detecting the difference between the local oscillator frequency $f_{L1}$ from the variable oscillator 26 and the high frequency incoming signal frequency $f_R$.

Considering signals of channels other than a desired channel as interference signals, the frequency range of the interference signals is, for instance, in case of TV bands in the United States of America, is between 54 to 890 MHz. The frequency or frequencies of the interference signal or signals will be expressed in terms of $f_u$ hereinbelow throughout the specification.

High harmonic interferences, such as $f_{L1} - 2f_u$, $f_{L1} - 3f_u$ and the like to be converted into $f_{IF1}$ when receiving a desired channel signal, necessarily occur regardless of which frequency is selected as the first intermediate frequency. However, such interferences may be removed by adding fixed band pass filters respectively for the VHF higher band, VHF lower band, and UHF band to the input side.

If the first intermediate frequency and the mixing method are respectively selected as described in the above, a frequency expressed in terms of $2f_u - f_{L1}$ becomes an interference signal in the UHF band. The degree of the interference due to this interference signal is great because the interference corresponds to the difference between the second harmonic of the interference signal and the fundamental wave of the local oscillator frequency signal. This point will be further described taking the case of receiving TV signals in the United States of America.

Figure 3:
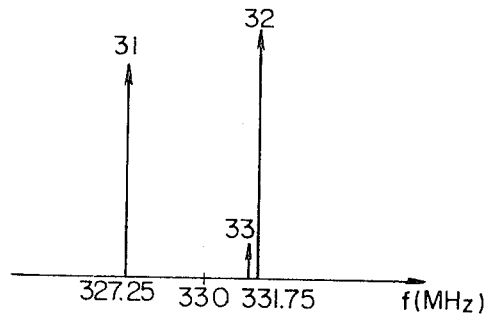
FIG. 3 is a chart showing the relationship between a first intermediate frequency of 330 MHz and interference signal caused by channel signals other than a desired channel signal.

Suppose channel 56 whose center frequency is 725 MHz is the desired one. Since the first intermediate frequency is 330 MHz, the local oscillator frequency $f_{L1}$ applied to the first mixing circuit 25 is 1055 MHz. If there exist signals of channel 51, whose video carrier frequency is 693.25 MHz and sound carrier frequency is 697.75 MHz, because of mixing between the second harmonic of the channel 51 signals and the local oscillator signal, the second harmonic component of the video carrier signal of the channel 51 gets in the first intermediate frequency band of the desired channel. FIG. 3 illustrates the relationship between these signals. In FIG. 3, a reference numeral 31 designates a frequency-converted sound carrier signal of 327.25 MHz of the desired channel, and 32 is a frequency-converted video carrier signal of 331.75 MHz of the same desired channel. A reference numeral 33 designates an interference signal of 331.5 MHz due to the second harmonic of the video carrier signal of the channel 51.

Furthermore, when the first intermediate frequency (330 MHz) and the mixing method are respectively set as mentioned in the above, when receiving signals of channel 46 whose center frequency is 665 MHz, video carrier frequency is 663.25 MHz, and sound carrier frequency is 667.75 MHz, the second harmonic of the video carrier frequency of the desired channel per se is frequency converted so that interference would occur having the relationship in frequency as illustrated in FIG. 3.

The above-described interference inevitably occurs because TV channel signals of UHF band are frequency converted into the first intermediate frequency between 300 and 400 MHz, and the interference will result in beat interference in a TV picture.

Next, let us suppose that the frequency of the output signal of the first mixing circuit 25, namely, the first intermediate frequency, is, for instance, 3000 MHz, where the first intermediate frequency $f_{IF1}$ equals the sum of the local oscillator frequency $f_{L1}$ and the incoming signal frequency $f_R$.

When mixing is effected in the above-mentioned manner, the difference between the second and third harmonics of the interference signal frequency $f_u$ and the second harmonic of the local oscillator frequency, i.e. $2f_{L1}-2f_u$ and $2f_{L1}-3f_u$, get in the first intermediate frequency band of the desired channel. This point will be further described taking the case of receiving TV channel signals in the United States of America.

Assuming that the tuner has been tuned to channel 50 the center frequency of which is 689 MHz, the local oscillator frequency applied to the first mixing circuit 25 is 2311 MHz. If there exist signals of channel 70 whose video carrier frequency is 807.25 MHz, and sound carrier frequency is 811.75 MHz, the difference between the second harmonic of the local oscillator frequency and the sound carrier frequency of the channel 70 is 2998.5 MHz so that this gets in the first intermediate frequency band of the channel 50, which is to be received, resulting in interference.

From the above, it will be understood that the present invention aims to remove the above described disadvantages inherent to the conventional TV tuner, and the invention provides a VHF-UHF all-band tuner of double superheterodyne type suitable for a TV set. One of the features of the present invention is that various interferences which could not be avoided according to the prior art, can be eliminated by properly selecting the first intermediate frequency and also by adopting a suitable mixing technique. Another feature of the present invention is that the frequency of the output signal of the first mixing circuit 25, i.e. the first intermediate frequency, is set between 2520 and 2700 MHz, and the first intermediate frequency is obtained by detecting the difference between the local oscillator frequency, which is higher than the first intermediate frequency, and the incoming or received signal frequency.

The manner by which the above-mentioned various interferences are eliminated will be described in detail hereinbelow. Considering signals of TV channels other than a desired channel as interference signals, the ranges of the interference signals, for instance in connection with TV bands in the United States of America, are respectively defined between 54 and 85 MHz of the VHF lower band, between 174 and 216 MHz of the VHF higher band, and between 470 and 890 MHz of the UHF band. In the same manner, in the case of TV bands in Japan, the interference signal ranges are respectively defined between 90 and 108 MHz of the VHF lower band, between 170 and 222 MHz of the VHF higher band, and between 470 and 770 MHz of the UHF band.

Spurious interferences which occur in the first mixing circuit 25 are caused, except for beat interferences between channels, by the fact that spurious signals produced by mixing the local oscillator frequency $f_{L1}$ applied to the first mixing circuit 25 with the harmonics of the interference signal, get in the first intermediate frequency band of the desired channel signal. This relationship will be given by the following formula:

$$|mf_{L1} \pm nf_u| = f_{IF1}$$

wherein "m" and "n" are respectively 0, 1, 2 or 3 . . . .

In the above, the harmonics of $f_{L1}$ and $f_u$ are respectively considered to be as far as the third order. Namely, harmonics of more than the third order do not have to be considered since the presence of such higher harmonics means that the system is saturated.

The above-mentioned various interference components will be classified in accordance with the order of the harmonics of the local oscillator frequency $f_{L1}$ as follows:

(1) Interferences caused by the fact that the second and third harmonics per se of the interference signal get in the first intermediate frequency band:

$$2f_u \text{ and } 3f_u$$

(2) Interferences caused by mixing the fundamental wave of the local oscillator frequency with the second and third harmonics of the interference signal:

$$|f_{L1} \pm 2f_u| \text{ and } |f_{L1} \pm 3f_u|$$

(3) Interference caused by mixing the second harmonic of the local oscillator frequency with the fundamental wave, second harmonic and the third harmonic of the interference signal:

$$|2f_{L1} \pm f_u|, |2f_{L1} \pm 2f_u| \text{ and } |2f_{L1} \pm 3f_u|$$

(4) Interference caused by mixing the third harmonic of the local oscillator frequency with the fundamental wave, second harmonic and the third harmonic of the interference signal:

$|3f_{L1} \pm f_u|$, $|3f_{L1} \pm 2f_u|$ and $|3f_{L1} \pm 3f_u|$

Let us suppose that the first intermediate frequency is selected as 2700 MHz. Considering the case of receiving TV channel signals in the United States of America, the range of the local oscillator frequencies applied to the first mixing circuit 25 is from 2757 to 3587 MHz. Let us further assume that interference signals reside in the VHF lower band, VHF higher band, and the UHF band between the entire range defined between 54 and 890 MHz.

Since the interference signals reside in the above-mentioned frequency ranges, the above-mentioned $2f_u$ and $3f_u$ of the item (1) do not directly get in the first intermediate frequency of the desired channel signal at all. In the interferences caused by mixing the fundamental wave of the local oscillator frequency with the fundamental wave and the harmonics of the interference signal as described in the item (2), only $f_{L1} - 2f_u$ and $f_{L1} - 3f_u$ will be interference signals because of the frequency relationship between the signals to be mixed.

The spurious interferences due to harmonics cannot be avoided no matter what frequency is selected as the first intermediate frequency, and no matter what kind of mixing method or technique is adopted so that it is necessary to suppress the interference signals, which result in the spurious interferences due to harmonics, at the input side. The above-described interferences of items (3) and (4), namely, signals which get in the first intermediate frequency band of the desired channel by mixing the second or third harmonics of the local oscillator frequency applied to the first mixing circuit 25, do not occur because of the frequency relationship such that the second harmonic of the local oscillator frequency is between 5514 and 7174 MHz, the third harmonic of the same is between 8271 and 10761 MHz, and the interference signal is between 54 and 890 MHz.

In the same manner, when it is intended to receive TV channel signals in Japan with the first intermediate frequency of 2700 MHz, the local oscillator frequency applied to the first mixing circuit 25 is between 2793 and 3467 MHz so that interferences by the channel signals other than the desired channel are the same as in the case of receiving U.S. TV channel signals except for the beat interference between channels.

Since the TV broadcasting bands in Japan reside in a range of 90 to 770 MHz, if the first intermediate frequency is set to 2520 MHz, interferences by the channel signals other than the desired channel during receiving Japanese TV signals are the same as described in the above. In other words, the only problem is the interference caused by mixing the fundamental frequency of the local oscillator signal applied to the first mixing circuit 25 with the harmonics of the other channel signals.

Another feature of the present invention is that both the combination of the first mixing circuit of 2500 to 3500 MHz band and the variable frequency local oscillator for processing the first intermediate frequency, and the combination of the second mixing circuit and the fixed local oscillator for converting the first intermediate frequency into the intermediate frequency of a TV set, are integrally formed in microwave integrated circuits respectively. Because the main portions are formed in an integrated circuit, uniform characteristics throughout a number of products are obtained so that mass production is readily effected.

Furthermore, in accordance with the present invention a VHF-UHF all-band tuner having a low-noise characteristic and a low modulation distortion characteristic can be provided.

In accordance with a preferred embodiment, the noise figure in a VHF band is approximately 5 dB and in UHF band, the same is approximately 7 dB, while the input signal level of immediately adjacent or second adjacent channel signals, which give a cross modulation distortion of 1 percent to the desired channel signal is from $-20$ to $-25$ dBm. The low cross modulation distortion characteristic has been achieved by a radio frequency amplifier having a low distortion characteristic, and a diode single balanced mixer having an original structure.

The input signal level of the first mixer, by which a cross modulation distortion of 1 percent is given to the desired channels signal is approximately 0 dBm, and the detailed structure of the first mixer will be described later.

In addition, by properly selecting the band of the fixed band pass filter, which selectively transmits the first intermediate frequency, and by the provision of the second intermediate frequency having an original structure, the degree of the cross modulation distortion given by the immediately adjacent channel signals to the desired channel signal can be reduced to the same level as that by the second adjacent channel signals.

In the above, it has been described how the various interferences are eliminated. Now let us discuss some conventional mixing circuits for further making the objects of the present invention clear.

Figure 4:
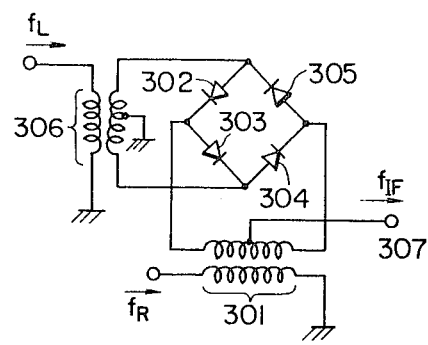
FIG. 4 is a circuit diagram of a conventional double-balanced mixer with a balance-to-unbalance transformer.

FIG. 4 is a circuit diagram of a conventional double-balanced mixer, also called a ring modulator, which has been widely used hitherto. In FIG. 4, reference numerals 301 and 306 designate balance-to-unbalance transformers, and in detail, the transformer 301 is used for receiving an incoming signal, while the other transformer 306 is used for receiving a local oscillator signal. Four diodes 302, 303, 304 and 305 constitute a bridge circuit between the secondary windings of the transformers 301 and 306. References $f_R$ and $f_L$ respectively indicate the incoming signal frequency and the local oscillator frequency. The secondary winding of the transformer 306 has a center tap connected to ground, while the secondary winding of the other transformer 301 has a center tap connected to an output terminal 307 from which an intermediate frequency signal will be derived.

Figure 5:
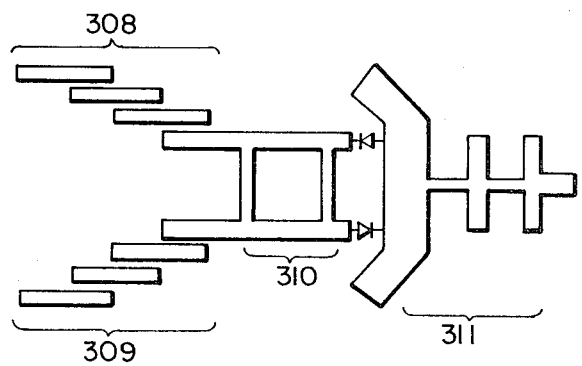
FIG. 5 is a top plan view of a conventional single-balanced mixer, which is in the form of a microwave integrated circuit, having a directional coupler.

FIG. 5 is a top plan view of a widely used conventional single-balanced mixer formed in a microwave integrated circuit (MIC), which mixer has a directional coupler of 3 dB. In FIG. 5, reference numerals 308 and 309 respectively designate band pass filters for the local oscillator signal and for the incoming signal. Each of the band pass filters 308 and 309 is connected to a directional coupler 310 of 3 dB which is connected via diodes (no numeral) to an intermediate frequency band pass filter 311. In this mixer circuit, since both branches of the directional coupler 310 require electrical lengths respectively corresponding to a quarter wavelength of the incoming signal frequency and a quarter wavelength of the local oscillator frequency, the mixer circuit tends to be bulky if the frequency is below several GHz.

Figure 6:
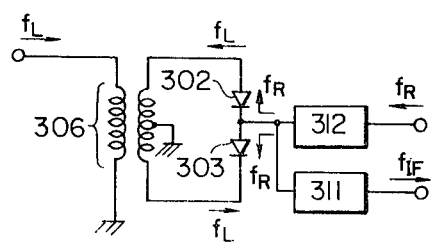
FIG. 6 is a circuit diagram of a conventional single-balanced mixer with a balance-to-unbalance transformer.

FIG. 6 is a circuit diagram of a widely used conventional single-balanced mixer with a balance-to-unbalance transformer. The local oscillator frequency $f_L$ is converted by means of a transformer 306 into balanced outputs, and the balanced outputs are respectively applied to mixing diodes 302 and 303 in such a manner that the phases or waveforms thereof are shifted by 180 degrees from each other. Therefore, the mixing diodes 302 and 303 have nonlinear conductances with the period of the local oscillator frequency. The incoming signal whose frequency is expressed in terms of $f_R$ is applied via a band pass filter 312 to the mixing diodes 302 and 303 through a junction between the mixing diodes 302 and 303 as indicated by arrows in FIG. 6. Thus, the incoming signal frequency $f_R$ is converted into an intermediate frequency $f_{IF}$, and the intermediate frequency developed at the junction is derived via a low pass filter 311.

Although the above-described conventional mixing circuits of FIG. 4 and FIG. 6 may be made small and compact by using a ferrite core for the transformer or transformers, the conversion loss assumes a large value, such as from 6 to 10 dB, since image frequency components and harmonic components of the local oscillator frequency are left as they are.

Figure 7:
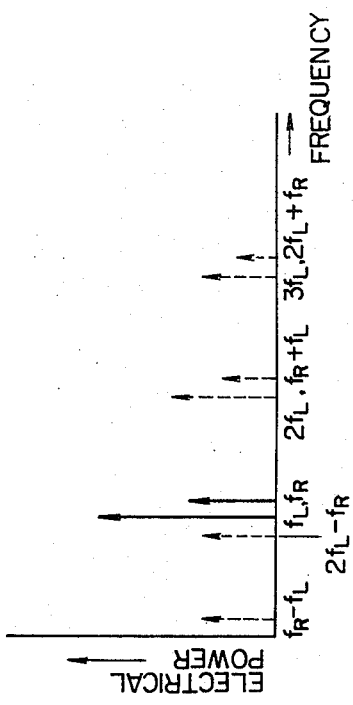
FIG. 7 is a spectrum chart showing frequencies which occur in a mixing diode.

Generally speaking, when a local oscillator signal whose frequency is expressed in terms of $f_L$ and an incoming or received signal whose frequency is expressed in terms of $f_R$ are respectively applied to a mixing diode, signals corresponding to the sum and the difference ($f_R-f_L$ and $f_R+f_L$) of and between the local oscillator frequency and the incoming signal frequency as well as the sum and the difference ($nf_L \pm f_R$) of and between harmonics of the local oscillator frequency and the incoming signal frequency are produced by the same mixing diode (see FIG. 7). In the above, "n" is 2, 3, 4 . . . . Therefore, if an image frequency component $2f_L-f_R$ and a sum component $f_L+f_R$ are effectively used by reconverting the same into the intermediate frequency $f_R-f_L$, the conversion loss of the mixing circuit would be considerably improved.

In the prior art, the image frequency component has been used in such a manner that the impedance viewed from the mixing diode equals zero or infinite by the use of an image frequency band pass filter and a band rejection filter for instance, in a waveguide type mixer and the balanced mixer of FIG. 5, which is made of an MIC, with a directional coupler. As a result, the conversion loss is improved to an extent. Furthermore, in some waveguide type mixers, a resonating window is provided in the waveguide for blocking the second harmonic of the local oscillator frequency and its side band signals.

However, in the prior art, an adequate consideration as to the sum component ($f_L+f_R$) of the local oscillator frequency and the incoming signal frequency as well as the harmonics of the local oscillator frequency, especially the second harmonic of the same, are not given.

Hereafter, the embodiments of the present invention will be described in detail with reference to FIG. 8 to FIG. 19 of the accompanying drawings.

Figure 8:
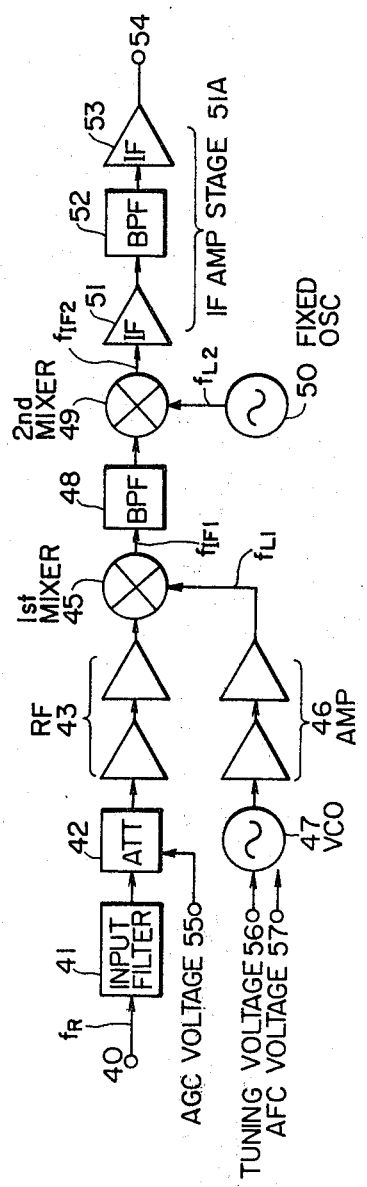
FIG. 8 is a schematic block diagram of a first embodiment of the VHF-UHF all-band tuner according to the present invention.

Reference is now made to FIG. 8 which shows a schematic block diagram of a VHF-UHF all-band tuner for receiving Japanese TV channels according to the present invention. An input signal applied to an input terminal 40 is delivered to an input filter circuit 41. The filter circuit 41 comprises a trap circuit and a high pass filter for eliminating interference signals, which interfere with the intermediate frequency of a TV set, FM signals, and the like. This filter circuit 41 attenuates signals of the intermediate frequency and its half frequency of the TV set by approximately 40 dB. The output signal of the input filter circuit 41 is applied to a variable attenuator 42 which comprises a pin diode. The loss in the transmission band of the variable attenuator 42 is approximately 1 dB in the VHF band, and is approximately 1.5 dB in the UHF band, while the maximum amount of attenuation is approximately 50 dB in the VHF band, and is approximately 40 dB in the UHF band. The output signal of the variable attenuator 42 is applied to a radio frequency (RF) amplifier 43 which comprises two transistor stages. The gain of the RF amplifier 43 is approximately 21 dB, and the noise figure of the same is equal to or less than 2.5 dB in the VHF band, and is equal to or less than 3.5 dB in the UHF band. The output signal of the RF amplifier 43 is applied to a first input terminal of a first mixing circuit 45 which comprises a diode single balanced mixer. The first mixing circuit 45 has a second input terminal for receiving a local oscillator signal. Namely, a voltage controlled oscillator 47, which comprises a single transistor stage, generates the above-mentioned local oscillator signal where the output signal of the voltage controlled oscillator 47 is amplified by a local oscillator signal amplifier 46 to a given level before applied to the second input terminal of the first mixing circuit 45. The voltage controlled oscillator 47 generates a necessary oscillating signal corresponding to a desired TV channel by voltage controlling. The amplifier 46 amplifies the output signal of the voltage controlled oscillator 47 to obtain an output of +15 dBm throughout 2.5 to 3.5 GHz. The first mixing circuit 45 converts the TV signal applied to its first input terminal by mixing the same with the local oscillator signal applied via the amplifier 46 from the voltage controlled oscillator 47, into a given first intermediate frequency of 2520 to 2700 MHz. If 2520 MHz is selected as the first intermediate frequency, which does not give interference, and also if the mixing method of detecting the difference between a desired TV channel signal frequency and the local oscillator frequency, i.e. the output signal frequency of the voltage controlled oscillator 47, applied to the first mixing circuit 45, the necessary frequency range of the voltage controlled oscillator 47 is from 2613 to 3287 MHz.

The first mixing circuit 45 is a novel one according to the present invention, and is of the diode single balanced type having a low-noise characteristic and a low-distortion characteristic. The noise figure of the first mixing circuit 45 is 7 dB in the VHF band, and is 8 dB in the UHF band, while the conversion loss on frequency conversion to 2520 MHz is 6 dB in the VHF band, and is 7 dB in the UHF band. The output signal of the first mixing circuit 45 is applied to a fixed frequency band pass filter 48 which selectively transmits the TV channel signal whose frequency has been converted into the first intermediate frequency of 2520 MHz. The fixed frequency band pass filter 48 is of coaxial type, and the band width thereof is 5 MHz so that interferences by adjacent channels in the following circuits are prevented to the utmost. The insertion loss of the fixed frequency band pass filter 48 is approximately 5 dB at the center frequency of 2520 MHz. The output signal of the fixed frequency band pass filter 48 is applied to a first input terminal of a second mixing circuit 49 having a second input terminal for receiving the output signal of a fixed oscillator 50. If the first intermediate frequency has been selected as 2520 MHz, the output frequency of the fixed oscillator 50 is 2463 MHz when intended to receive Japanese TV channel signals. The second mixing circuit 49 is of diode single balanced type, and the conversion loss thereof is 5 dB, and the noise figure thereof is 5 dB. The second mixing circuit 49 converts the first intermediate frequency, which has been selectively transmitted via the frequency fixed band pass filter 48, into a second intermediate frequency. In case of receiving Japanese TV channels the first intermediate frequency is converted into a band of 57 MHz.

The output signal of the second mixing circuit 49 is applied to an intermediate frequency (IF) amplifier 51 which amplifies the second intermediate frequency signal. The gain and the noise figure of the second intermediate frequency amplifier 51 are respectively 15 dB and 2.5 dB, while the level of the immediately adjacent channel signals, which give cross modulation distortion of 1 percent to the desired channel, is greater than −20 dBm. A reference numeral 52 indicates the combination of a trap and a fixed frequency band pass filter for attenuating the video carrier signal component and the sound carrier signal component of the upper and lower immediately adjacent channels so that interference by an adjacent channel signal in a following intermediate frequency amplifier is suppressed. The insertion loss of the above-mentioned combination of the trap and the frequency fixed band pass filter at the second intermediate frequency of 57 MHz is approximately 3 dB, while the amount of attenuation at the video carrier frequency of 52.75 MHz of the upper immediately adjacent channel and at the sound carrier frequency of 60.25 MHz of the lower immediately adjacent channel is approximately 30 dB. The output signal of the band pass filter 52 is applied to an amplifier 53 of output tuning type to be amplified to a given level. The gain of the amplifier 53 is 20 dB. In FIG. 8, a terminal 55 for supplying an AGC voltage is connected to the variable attenuator 42, while terminals 56 and 57 respectively for supplying a tuning voltage and an AFC voltage are connected to the voltage controlled oscillator 47.

The automatic gain control (AGC) in the tuner of FIG. 8 is adjusted in such a manner that the input level of the desired channel signal of the RF amplifier 43 is equal to or below −55 dBm.

Generally, in a tuner of double superheterodyne type, it is necessary to perform automatic frequency controls (AFC) with respect to the local oscillator, i.e. the voltage controlled oscillator, of the first mixing circuit, and to the fixed oscillator of the second mixing circuit. However, in accordance with the preferred embodiment of the present invention of FIG. 8, only the voltage controlled oscillator 47 is equipped with an AFC terminal because an oscillator, whose frequency is stable against the voltage variation in power source and against the temperature variation, is used as the fixed oscillator 50.

In accordance with the present invention the image frequency in connection with the first mixing circuit 45 equals a frequency which is higher than the desired channel frequency by twice the first intermediate frequency, i.e. 5040 MHz. Thus, in case of receiving Japanese TV band signals, the image frequency lies in a range from 5133 to 5807 MHz. Since the input terminal of the first mixing circuit 45 is connected to the output terminal of the RF amplifier 43, problem with respect to image interference in the first mixing circuit 45 does not arise at all.

The image frequency in connection with the second mixing circuit 49 is lower than the first intermediate frequency by twice the second intermediate frequency. Although only the fixed frequency band pass filter 48 is used to reject the image frequency, attenuation of 75 to 80 dB is obtained by means of the fixed frequency band pass filter 48 in a frequency band, which is lower than the center frequency by 114 MHz, namely in the vicinity of 2406 MHz so that the suppressing characteristic of the image signal which occurs in the second mixing circuit 49 is 75 to 80 dB.

In this embodiment, the total noise figure of the tuner is approximately 5 dB in the VHF band, and is approximately 7 dB in the UHF band. When the level of a desired channel signal is below −55 dBm, which is considered as the severest condition with respect to the interference characteristic of a tuner, and when the variable attenuator does not work, then the input signal level of the immediately adjacent or second adjacent channel signals, which give cross modulation distortion of 1 percent to the second intermediate frequency signal of the desired channel signal, is from −20 to −25 dBm.

Figure 9:
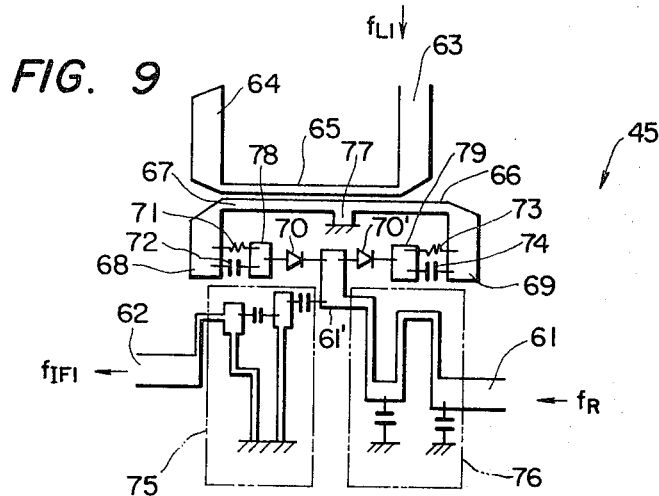
FIG. 9 is a schematic diagram of the first mixing circuit shown in FIG. 8.

Hereinbelow, characteristic individual circuits in the embodiment will be described in detail. FIG. 9 shows a schematic circuit arrangement of the first mixing circuit 45 of FIG. 8. This mixing circuit 45 has an original structure using microstriplines, and is of diode single balanced type. The mixing circuit 45 comprises microstriplines formed on a dielectric substrate (not shown), such as a plate made of Teflon (trademark) fiber glass, diodes, capacitors and resistors. The first mixing circuit 45 is an up-converter which converts the frequency of a TV channel signal of the VHF or UHF bands into an appropriate first intermediate frequency between 2520 and 2700 MHz, where the mixing circuit features that it is compact in size and it is of low-distortion characteristic.

The circuit arrangement of FIG. 9 is formed on a substrate made of a Teflon (trademark) fiber glass, and the size thereof is approximately 28 millimeters by 25 millimeters. In FIG. 9, reference numerals 61, 62 and 63 respectively designate terminals made of striplines of 50 ohms for respectively receiving an incoming signal, for deriving the first intermediate frequency signal, and for receiving the local oscillator signal. The incoming signal frequency is from 50 to 1000 MHz, while the local oscillator frequency is from 2570 to 3520 MHz.

The combination of a stripline 65 and striplines 66 and 67 constitute parallel coupled lines where the space between the parallel striplines 65, 66 and 67 is approximately 0.1 millimeter. Assuming that the wavelength of approximately the center frequency, i.e. 3000 MHz, of the local oscillator signal on the substrate is expressed in terms of $\lambda_{gLl}$, the electrical length of the parallel coupled portion between the stripline 65 and the striplines 66 and 67 is approximately $\lambda_{gLl}/8$, and in this length, the electrical length of the parallel coupled portion between the striplines 65 and 66 is approximately $\lambda_{gLl}/40$.

A junction portion between the striplines 66 and 67 is connected via a ground stripline 77 to ground. An open-ended stub 64 is connected to the stripline 65, and the stub 64 has a characteristic impedance of 50 ohms and an electrical length of approximately $\lambda_{gLl}/10$. The parallel coupled lines 65, 66 and 67, the stub 64, and the ground stripline 77 constitute a balance-to-unbalance transformer (balun) at the local oscillator frequency band.

Reference numerals 68 and 69 respectively designate output striplines of the balun, and a chip resistor 71 and a chip capacitor 72 are connected to the output stripline 68, while a chip resistor 73 and a chip capacitor 74 are connected to the other output stripline 69. The resistances and the capacitances of these resistors 71 and 73, and the capacitances of these capacitors 72 and 74 are selected so that a low-distortion characteristic can be actualized without increasing the conversion loss. For instance, the resistances are respectively 10 ohms and the capacitances are respectively 5 picofarads. The resistor 71 and the capacitor 72 constitute a parallel circuit between the output stripline 68 and a first terminal 78, while the resistor 73 and the capacitor 74 constitute a parallel circuit between the output stripline 69 and a second terminal 79. An anode of a silicon Shottky barrier diode 70 is connected to the first terminal, while a cathode of another silicon Shottky barrier diode 70' is connected to the second terminal 79. The cathode of the Shottky barrier diode 70 and the anode of the other Shottky barrier diode 70' are connected to each other at a stripline 61'. A reference numeral 76 designates a low pass filter for receiving the incoming signal, from the terminal 61 while a reference numeral 75 designates a high pass filter through which the output intermediate frequency is delivered to the terminal 62. The output terminal of the low pass filter 76 and the input terminal of the high pass filter 75 are respectively connected to the above-mentioned stripline 61'. The combination of the high pass filter 75 and the low pass filter 76 constitutes a diplexer for separating input and output signals.

The mixing circuit of FIG. 9 actualizes a low-noise characteristic and a low-distortion characteristic by the provision of the balun for the local oscillator frequency, having an original structure and a balanced characteristic throughout a wide range, and by inserting parallel circuits of suitable resistors and capacitors between one output terminal 68 of the balun and one terminal of the diode 70 and also between the other output terminal 69 of the balun and one terminal of the other diode 70'.

Prior to describing the circuit arrangement of the second mixing circuit 49 of FIG. 8, the fundamental circuit arrangement for the second mixing circuit 49 will be described with reference to FIG. 10 for a better understanding of the structure and operation of the second mixing circuit 49.

Figure 10:
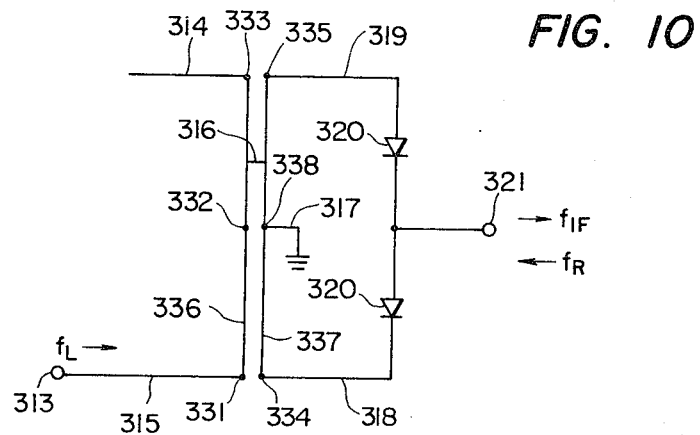
FIG. 10 is a schematic diagram showing the fundamental structure of the second mixing circuit shown in FIG. 8.

FIG. 10 shows the fundamental structure of the second mixing circuit 49. A reference numeral 313 designates an input terminal for receiving a local oscillator signal $f_L$, and 314 designates an open-ended stub. Numerals 315, 316, 317, 318, 319, 336 and 337 are all striplines. The stripline 315 is connected at its one end to the input terminal 313, and is connected at its other end to one end of the stripline 336. The other end of the stripline 336 is connected to one end of the above-mentioned stub 314. The stripline 337 is arranged in parallel with the stripline 336 having a given space therebetween. Both ends of the stripline 337 are respectively connected to one ends of the striplines 318 and 319. A series circuit of mixing diodes 320 is interposed between the other ends of the striplines 318 and 319. A junction (no numeral) connecting the two diodes 320 is connected to a terminal 321. This terminal 321 is used for receiving the incoming signal $f_R$ for deriving the intermediate frequency signal $F_{IF}$. The stripline 317 whose one end is connected to ground is connected at the other end thereof to the stripline 337 at about a midway point of the stripline 337. The junction point between the striplines 317 and 337 is designated as 338. In the same manner, the junction points between the striplines 315 and 336, between the stripline 336 and the stub 314, between the striplines 318 and 337, and between the striplines 319 and 337 are respectively designated as 331, 333, 334 and 335.

The striplines 336 and 337, which are arranged in parallel, constitute parallel coupled lines, and a point on the stripline 336 corresponding to the junction 338 is designated as 332 for the sake of description. The combination of the coupling stripline defined between the point 332 and the junction 331 and the coupling stripline defined between the junctions 338 and 334 constitutes an in-phase transformer. On the contrary, the combination of the coupling stripline defined between the point 332 and the junction 333 and the coupling stripline defined between the junctions 338 and 335 constitutes an opposite-phase transformer.

The above-mentioned stripline 316 is connected between the coupling striplines which constitute the above-mentioned opposite phase transformer. With this arrangement, the whole coupling portion in the transmission lines constitute a balance-to-unbalance transformer for the local oscillator frequency band. Since the stripline 316 is provided to make a short circuit between the striplines 336 and 337, the impedance viewed from the transmission lines 318 and 319, to which the mixing diodes 20 are respectively connected, equals zero at the sum component frequency band of the local oscillator frequency $f_L$ and the incoming signal frequency $f_R$ as well as at the second harmonic frequency $2f_L$ band of the local oscillator frequency.

In general, when comparing an in-phase or positive-phase transformer with an opposite-phase or negative-phase transformer, the latter has superior high frequency characteristics. This is because the resonance condition as to the length of the coupled lines is established in the vicinity of $\beta l = \pi/2$ in case of the in-phase transformer, and in the vicinity of $\beta l = \pi$ in case of the opposite-phase transformer wherein $\beta$ is the phase constant, and l is the length of the coupled lines.

Accordingly, the coupling coefficient in the in-phase transformer at the frequency bands of $f_L + f_R$ and $2f_L$ is small, whereas the coupling coefficient in the opposite-phase transformer at the same frequency bands is great. As a result, balance between the in-phase and opposite-phase transformers is lost so that the opposite-phase transformer side of the entire transformer has a load $Z_L$ at the above-mentioned frequency bands as shown in an equivalent circuit of FIG. 11A where the load $Z_L$ varies in accordance with the coupling degree of the opposite-phase transformer. The in-phase transformer side has an impedance substantially equal to zero as the load thereof because the coupling degree is extremely small.

Figure 11A:
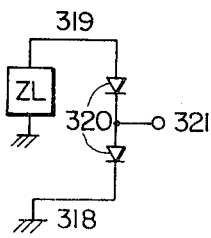
FIG. 11A is an equivalent circuit of the balance-to-unbalance transformer of FIG. 10 in the absence of the short-circuit stripline at the sum frequency of the local oscillator frequency and an input signal frequency, and at the second harmonic frequency of the local oscillator frequency.
Figure 11B:
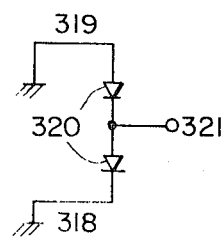
FIG. 11B is an equivalent circuit of the balance-to-unbalance transformer of FIG. 10 in the presence of the short-circuit stripline at the same frequencies.

In accordance with the present invention the above-mentioned stripline 316 for making a short circuit between the striplines 336 and 337 is additionally employed to make the impedances viewed from the striplines, to which the mixing diodes 320 are respectively connected, substantially zero as illustrated in a second equivalent circuit of FIG. 11B. In order that the transformer has a characteristics represented by the equivalent circuit of FIG. 11B the position of the stripline 316 has to be selected in view of the characteristic impedance of the open-ended stub 314 and the electrical length of the same.

However, the position of the stripline 316 for making the short circuit may also be selected in accordance with the following experimental method. Namely, a suitable position may be selected by detecting the minimum conversion loss while making a connection between the striplines 336 and 337 in the opposite-phase transformer by means of a suitable tool, such as a pair of tweezers.

With the above-mentioned arrangement, the sum component ($f_L+f_R$) among various signals produced by the mixing diodes 320 is almost perfectly reflected because of the zero impedance of the striplines 318 and 319 to which the mixing diodes 320 are resepectively connected. As a result of the reflection, the sum component ($f_L+f_R$) is fed to the mixing diodes 320 once more to effect a frequency conversion expressed by $f_L+f_R-2f_L=f_R-f_L$. Consequently, the conversion loss characteristic can remarkably improved.

Figure 12:
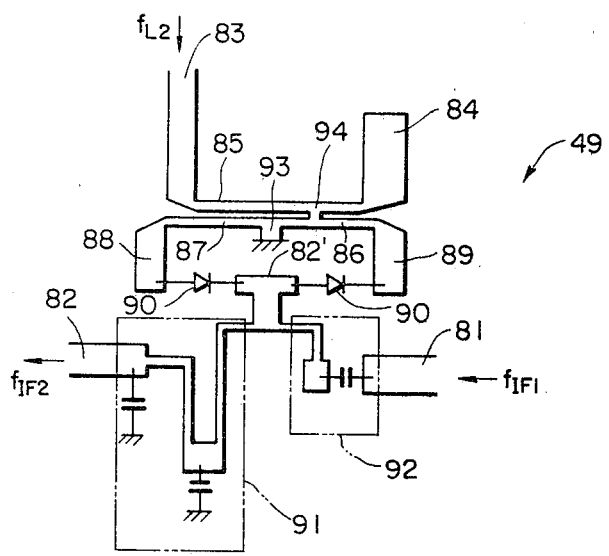
FIG. 12 is a schematic diagram of the second mixing circuit shown in FIG. 8.

Hence, reference is now made to FIG. 12 which shows a schematic circuit arrangement of the second mixing circuit 49 of FIG. 8. The mixing circuit 49 has an original structure of diode single palance type where the mixing circuit 49 is based on the fundamental structure of FIG. 10. The second mixing circuit 49 has features that the circuit is compact in size and has a low-noise characteristic. The circuit arrangement of FIG. 12 is formed on a substrate (not shown) made of Teflon (trademark) fiber glass, and has a size of approximately 25 by 25 millimeters. In FIG. 12, reference numerals 81, 82 and 83 respectively designate terminals made of microstriplines of 50 ohms for respectively receiving an input signal, for deriving the second intermediate frequency signal, and for receiving the local oscillator signal. The input signal corresponds to the first intermediate frequency signal which has been selectively transmitted through the fixed frequency band pass filter 48, and the frquency assumes a suitable value between 2520 and 2700 MHz. In the embodiment of FIG. 8, the first intermediate frequency is 2520 MHz. The local oscillator frequency is lower than the input signal frequency, i.e. the first intermediate frequency, by the second intermediate frequency so that the necessary second intermediate frequency will be obtained. In the embodiment of FIG. 8, the local oscillator frequency is set to 2463 MHz when it is intended to receive Japanese TV band signals.

The combination of a stripline 85 and striplines 86 and 87 constitutes parallel coupled lines where the space between the parallel striplines 85, 86 and 87 is approximately from 0.06 to 0.1 millimeter. Assuming that the wavelength of the local oscillator frequency of 2463 MHz on the substrate is expressed in terms of $\lambda_{gL2}$, the electrical length of the parallel coupled portion along the stripline 85 and the striplines 86 and 87 is approximately $\lambda_{gL2}/10$, and in this length, the electrical length of the parallel coupled portion along the striplines 85 and 86, which constitute the in-phase transformer, is approximately from $\lambda_{gL2}/30$ to $\lambda_{gL2}/35$. The width of the striplines 85, 86 and 87 may be determined by various factors, such as the material of the substrate, and in this embodiment, the width is 0.4 millimeters.

A junction portion between the striplines 86 and 87 is connected via a ground stripline 93 to ground. A stripline 94 is connected between the stripline 85 and the stripline 86 at a midway point of the stripline 86 for making a short circuit therebetween. The stripline 94 will be referred to as a short-circuit stripline hereinafter. With the provision of the short-circuit stripline 94, the sum component ($f_{L2}+F_{IF1}$) of the local oscillator frequency ($f_{L2}$) and the input signal, i.e. the first intermediate frequency ($f_{IF1}$) can be effectively used to obtain the necessary difference component ($f_{IF1}-f_{L2}$) so that the conversion loss characteristic and the noise figure characteristic with respect to the second intermediate frequency are respectively improved. An open-ended stub 84 which corresponds to the stub 314 of FIG. 10, is connected to the stripline 85, and the stub 85 has a characteristic impedance of 35 ohms and an electrical length of approximately $\lambda_{gL2}/12$. The parallel coupled transmission lines 85, 86 and 87, the stub 84, the ground stripline 93, and the short-circuit stripline 94 constitute the above-mentioned balance-to-unbalance transformer (balun) at the local oscillator frequency. The balun has two output terminals 88 and 89 which respectively comprise striplines respectively connected to the striplines 87 and 86. An anode of a silicon Shottky barrier diode 90 is connected to the output terminal 88 and the cathode of the diode 90 is connected to a stripline 82'. In the same manner another silicon Shottky barrier diode 90' is connected between the output terminal 89 and the stripline 82' in such a direction that the anode thereof is connected to the terminal 89.

A reference numeral 92 designates a band pass filter for receiving the input signal from the terminal 81, while a reference numeral 91 designates a low pass filter through which the output second intermediate frequency signal is delivered to the terminal 82. The output terminal of the band pass filter 92 and the input terminal of the low pass filter 91 are respectively connected to the above-mentioned stripline 82'. The combination of the band pass filter 92 and the low pass filter 91 constitutes a diplexer for separating the input and output signals.

Figure 13:
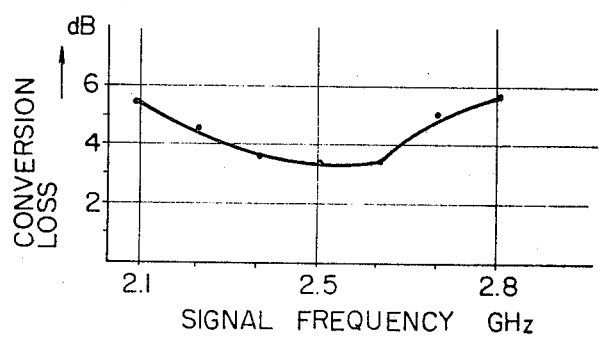
FIG. 13 is a graphical representation showing the conversion loss of the second mixing circuit shown in FIG. 12.

FIG. 13 is a graphical representation of the conversion loss in the above-described second mixing circuit 49. The conversion loss at a frequency of 2.5 GHz is 3.4 dB which is considerably smaller than a value obtained in the prior art.

Figure 14A:
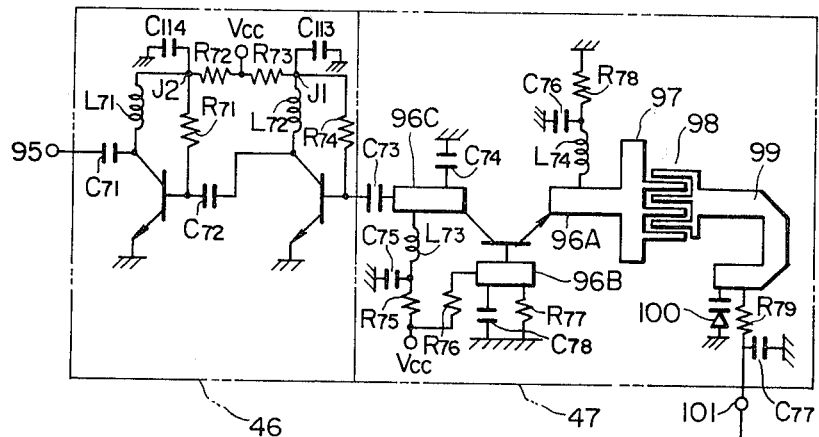
FIG. 14A is a schematic circuit diagram of the combination of the voltage controlled oscillator equipped with an AFC circuit; and the local oscillator frequency amplifier connected thereto shown in FIG. 8.
Figure 14A:
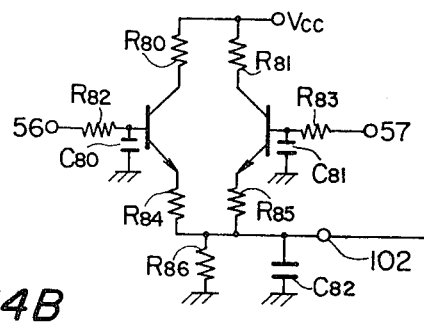

FIG. 14A shows circuit arrangements of the voltage controlled oscillator 47 and the amplifier 46 shown in FIG. 8. In the voltage controlled oscillator 47, an inter-digital capacitor is used for coupling the resonator and the oscillating circuit thereof so that the voltage controlled oscillator 47 is capable of oscillating throughout a wide range, while the coupling portion does not require any adjustment. The voltage controlled oscillator 47 has an oscillation frequency band width of 1000 MHz so that it is possible to receive TV signals of VHF and UHF bands by means of a single tuner without effecting switching.

The circuits of FIG. 14A are formed on a substrate made of Teflon (trademark) fiber glass where the resonator is constructed of a stripline 99 and a varactor diode 100. The stripline 99 is of substantially U-shape so that the resonator can be small in size without deteriorating its characteristics. The oscillating frequency will be controlled by a voltage applied to a terminal 101.

A varactor diode 100 is connected between one side of the U-shaped stripline 99 and ground, while a resistor R79 is connected between the one side of the stripline 99 and the terminal 101 which is grounded via a capacitor C77. The other side of the U-shaped stripline 99 is connected to one terminal of the inter-digital capacitor 98. The other terminal of the inter-digital capacitor 98 is connected to a stub 97 which is employed for effecting impedance matching between the oscillating circuit side and the resonator. The stub 97 is connected to a stripline 96A which is connected via a series circuit of a resistor R78 and a choke coil L74 to ground where a junction connecting the resistor R78 and the choke coil L74 is connected via a capacitor C76 to ground. The opposite end of the stripline 96A is connected to an emitter of a transistor (no numeral) the base of which is connected to a stripline 96B. A parallel circuit of a resistor R77 and a capacitor C78 is connected between the stripline 96B and ground, while a resistor R76 is connected between the stripline 96B and a terminal to which a power supply Vcc is connected. The collector of the transistor is connected to a stripline 96C which is ground via a capacitor C74. The stripline 96C is further connected via a series circuit of a choke coil L73 and a resistor R75 to the power supply terminal. A junction between the choke coil L73 and the resistor R75 is connected via a capacitor C75 to ground. The stripline 96C is further connected via a capacitor C73 to a base of a first transistor included in the amplifier 46. Each of the above-mentioned choke coils L73 and L74 has an electrical length expressed in terms of $\lambda_{gL1}/4$ assuming that the wavelength of the center frequency, i.e. 3000 MHz of the oscillator frequency on the substrate is expressed in terms of $\lambda_{gL1}$. The capacitors C75, C76, and C77 are used for transmitting high frequency signals to ground. With the provision of the combination of the stripline 96B and the capacitors C74 and C78 the negative resistance of the oscillating circuit can be controlled and in the preferred embodiment, the capacitance of the capacitor C74 is approximately 1 picofarad, and the capacitance of the capacitor C78 is between 5 and 10 picofarads. The characteristic impedance of these striplines 96A and 96C is 50 ohms, while the electrical length of these striplines 96A to 96C is preferably less than $\lambda_{gL1}/8$.

The local oscillator signal amplifier 46 comprises the above-mentioned first transistor (no numeral) and a second transistor (no numeral). A series circuit of resistors R73 and R74 is interposed between a power supply terminal and the base of the transistor. A coil L72 is interposed between a junction J1 connecting the resistors R73 and R74 and the collector of the first transistor the emitter of which is connected to ground. The collector of the first transistor is connected via a capacitor C72 to a base of the second transistor the emitter of which is grounded. A series circuit of resistors R71 and R72 is interposed between the power supply terminal and the base of the second transistor. A coil L71 is interposed between the collector and a junction J2 connecting the resistors R71 and R72. The collector of the second transistor is connected via a capacitor C71 to an output terminal 95 which is connected, inturn, to the second input terminal of the first mixing circuit 45 of FIG. 8. Two capacitors C113 and C114 are respectively interposed between the junctions J1 and J2 and ground.

With the provision of the combination of the voltage controlled oscillator 47 and the amplifier 46 it is possible to supply the first mixing circuit 45 with a local oscillator signal having an output power of 15 dBm throughout 2500 to 3500 MHz.

The voltage controlled oscillator 47 of FIG. 14A is equipped with an AFC (automatic frequency control) circuit. The AFC circuit of FIG. 14A comprises two transistors which are coupled in parallel between a power supply Vcc and ground. A base of a first transistor (no numeral) is connected via a resistor R82 to the terminal 56, while a base of a second transistor (no numeral) is connected via a resistor R83 to the terminal 57. As described with reference to FIG. 8, a variable voltage for effecting tuning is applied to the terminal 56, while a variable AFC voltage, which varies in accordance with the deviation in the oscillating frequency, is applied to the terminal 57. These two voltages are superimposed on each other to make a resultant voltage which is derived from an output terminal 102 connected via resistors R84 and R85 to the emitters of the first and second transistors. The output terminal 102 is connected to the terminal 101 of the voltage controlled oscillator 47 to supply the voltage controlled oscillator 47 with the resultant voltage produced in the AFC circuit. Since the oscillator frequency deviation is compensated for by means of this AFC circuit, a high stability in frequency, which is required when receiving color picture signals, is readily obtained. Although an undesirable phenomenon such that a current flows into the power supply side when the tuning voltage has a specific relationship with respect to the AFC voltage, is inevitable in an AFC circuit utilizing a voltage dividing circuit having resistors, such an undesirable phenomenon does not occur in the above-described AFC circuit of FIG. 14A.

Figure 14B:
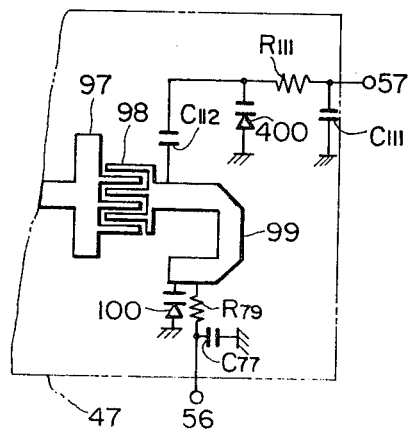
FIG. 14B is a schematic circuit diagram of a modified AFC circuit which may be used in combination with the voltage controlled oscillator of FIG. 14A.

FIG. 14B shows a schematic circuit diagram of a modified AFC circuit which may be used in combination with the voltage controlled oscillator 47 in place of the abovedescribed AFC circuit of FIG. 14A. In this modified AFC circuit, the AFC voltage is applied via the terminal 57 to an additionally provided varactor 400 connected to the U-shaped resonator 99 of the voltage controlled oscillator 47, while the tuning voltage is applied to the tuning varactor 100 directly via the terminal 56 which corresponds to the terminal 101 of FIG. 14A.

In detail, the AFC circuit of FIG. 14B comprises a series circuit of a resistor R111 connected to the terminal 57 and a capacitor C112 connected to the U-shaped resonator 99 in the vicinity of the inter-digital capacitor 98. The above-mentioned additionally provided varactor 400 is connected between a junction connecting the resistor R111 and the capacitor C112, and ground. A capacitor C111 is connected between the terminal 57 and ground.

By the use of the simple AFC circuit of FIG. 14B there is no need to use the AFC circuit of FIG. 14A. The AFC circuit of FIG. 14B has an advantage that the AFC response is uniform throughout the entire variable frequency range. In other words, the degree of the frequency variation by a given AFC voltage is substantially constant throughout the wide local oscillator frequency band. Since the additionally provided varactor 400 is used only for AFC, the maximum variable frequency range is not required to be as large as that of the tuning varactor diode 100. Therefore, a varactor of low cost may be used as the varactor 400.

Figure 15:
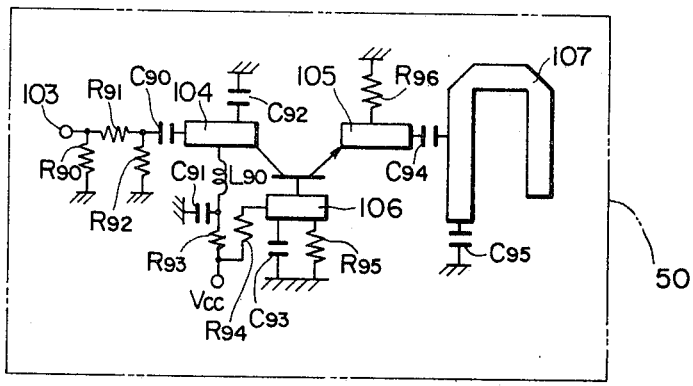
FIG. 15 is a schematic circuit diagram of the fixed frequency oscillator shown in FIG. 8.

Reference is now made to FIG. 15 which shows a circuit diagram of the fixed frequency oscillator 50 of FIG. 8. The fixed oscillator comprises a substantially U-shaped half wave resonator equipped with a loading capacitance. Therefore, the oscillator can be compact in size without deteriorating the characteristics thereof. A magnetic coupling is adopted in order to couple the resonator with an oscillating circuit in the fixed oscillator, where the coupling coefficient varies in accordance with the distance from an apparent short-curcuited point at the center of the half wave resonator. Furthermore, in the oscillator of FIG. 15, the coupling between the resonator and the oscillating circuit is made as loose as possible, while biasing conditions of the transistor and the emitter resistor are suitably selected so that a very stable oscillator is actualized with a small number of parts. In detail, the frequency variation can be suppressed within 200 to 300 KHz.

The fixed frequency oscillator of FIG. 15 is formed on a substrate made of Teflon (trademark) fiber glass. The above-mentioned resonator comprises a U-shaped stripline 107 and a fixed capacitor C95 connected to one end of the U-shaped stripline 107. The U-shaped stripline 107 is connected via a capacitor C94 to a stripline 105 connected to the emitter of the transistor, while the stripline 105 is connected via a resistor R96 to ground. The base of the transistor is connected to a stripline 106 coupled via a parallel circuit of a capacitor C93 and a resistor R95 to ground. The stripline 106 is connected via a resistor R94 to a power supply Vcc terminal. The collector of the transistor is connected to a stripline 104 connected via a capacitor C92 to ground. A series circuit of a choke coil L90 and a resistor R93 is interposed between the stripline 104 and the terminal connected to the power supply Vcc. A junction connecting the choke coil L90 and the resistor R93 is connected via a capacitor C91 to ground. The stripline 104 is connected via a series circuit of a capacitor C90 and a resistor R91 to an output terminal 103 which is grounded via a resistor R90. A resistor R92 is interposed between a junction connecting the capacitor C90 and the resistor R91, and ground. The characteristic impedance of these striplines 104 and 105 is 50 ohms, while the electrical length of these striplines 104 and 105 is preferably less than $\lambda_{gL2}/8$.

With this arrangement, an output oscillating frequency is developed at the output terminal 103 to be applied to the second input terminal of the second mixing circuit 49 of FIG. 8. The choke coil L90 has an electrical length expressed in terms of $\lambda_{gL2}/4$ assuming that the wavelength of the oscillating frequency of 2463 MHz on the substrate is expressed in terms of $\lambda_{gL2}$. The capacitor C91 is used for transmitting high frequency signals to ground. The negative resistance of the oscillating circuit can be controlled by means of the combination of the capacitors C92 and C93 and the stripline 106. In the preferred embodiment, the capacitance of the capacitor C92 is approximately 1 picofarad, and the capacitance of the capacitor C93 is between 10 and 20 picofarads. Fine adjustment of the oscillating frequency may be achieved by changing the space between a tuning adjust screw, which is located close to the open end of the U-shaped microstripline 107, and the open end.

Figure 16:
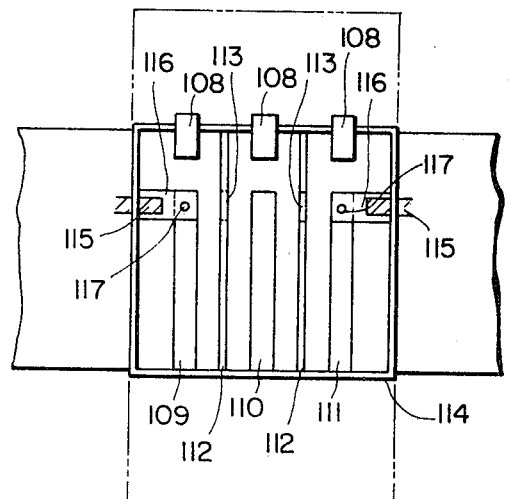
FIG. 16 is a schematic top plane view of the fixed frequency band pass filter shown in FIG. 8.

FIG. 16 illustrates a schematic top plan view of the fixed frequency filter 48 of FIG. 8, which filter 48 is used for selectively transmitting the first intermediate frequency signal. The filter 48 is of three-stage resonator type where coupling between adjacent stages is effected by means of coupling through-holes made in shielding plates.

The filter of FIG. 9 has a size expressed in terms of 26 (width)×40 (length)×14 (height) millimeters. The filter 48 comprises a casing 114, three resonators 109, 110 and 111, and adjust screws 108. The combination of the resonators 109 to 111 and the adjust screws 108, by which tuning is effected, constitutes a resonating circuit. Two strip-like dielectric substrates 116 are fixedly connected respectively by means of screws 117 to two resonators 109 and 111 which are located at both ends in the casing 114. Two input and output transmission lines 115 are respectively placed on the dielectric substrates 116 where one end of each of the transmission lines 115 projects outwardly beyond the casing 114. These input and output transmission lines 115 are used for directly coupling the filter between two microwave integrated circuits corresponding to the first and second mixing circuits 45 and 49 of FIG. 8. Since coaxial connectors are not used for coupling the filter, the filter does not suffer from impedance miss matching so that characteristic deterioration due to coupling is prevented. In addition, since inter-stage coupling is effected through the coupling through-holes 113 made in the shielding plates 112, characteristics of high harmonic spurious signals of the filter are improved so that spurious signal interference due to mixing of harmonics of the two local oscillator signals from both the voltage controlled oscillator 47 and the fixed frequency oscillator 50 is reduced. The band width of the filter 48 is set between 3 and 5 MHz in order to ensure the characteristic of the desired channel signal and to improve the interference-rejection characteristics in the following circuits. The characteristics of the filter 48 assuming that the center frequency is 2520 MHz and the band with is 5 MHz, are such that the insertion loss is less than 5 dB; input/output VSWR is below 1.5; and the attenuation is 75 to 80 dB at frequencies expressed in terms of the center frequency ±114 MHz.

Figure 17:
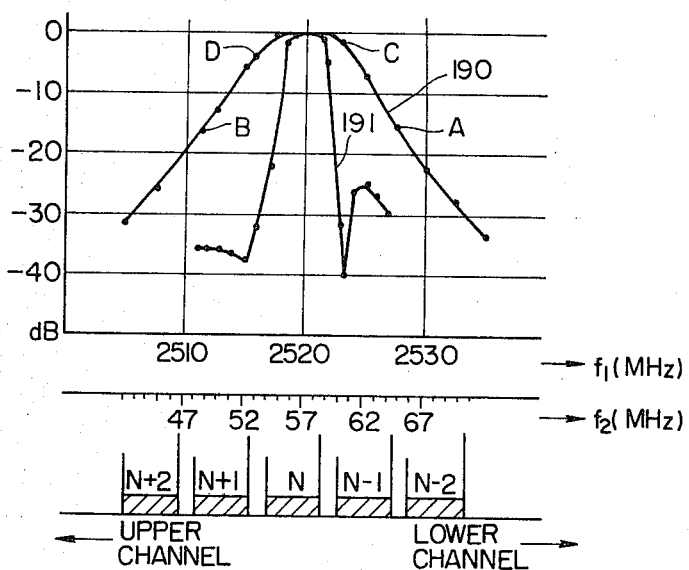
FIG. 17 is a graphical representation showing the relationship between the frequency response of the frequency fixed band pass filter of FIG. 16 and the frequency response of the second intermediate frequency amplifying stage of FIG. 8.

FIG. 17 is a graphical representation showing the relationship between the frequency response of the frequency fixed band pass filter 48 and the frequency response of the second intermediate frequency amplifying stage 51A, i.e., the combination of the intermediate frequency amplifier 51, the fixed frequency band pass filter 52 and the amplifier 53. In FIG. 17 a reference numeral 190 indicates the former, and 191 indicates the latter. The frequency responses illustrated by curves respectively indicate the relative attenuation with respect to the attenuation at the center frequencies thereof. A frequency scale designated as $f_1$ corresponds to the frequencies for the response curve 190, while another frequency scale designated as $f_2$ corresponds to the frequencies for the response curve 191. References N, N+1, N−1, N+2 and N−2 respectively indicate the desired channel, an upper immediately adjacent channel, a lower immediately adjacent channel, an upper second adjacent channel and a lower second adjacent channel. Arrows respectively shown at the right side of the channels indicate the video carrier frequency side, and straight line at the left sides of channels indicate the sound carrier frequency sides. As illustrated in the graph of FIG. 17, the attenuation degree of the filter 48 at the second adjacent channels (N+2 and N−2) is over 20 dB (see curve 190). Although the attenuation degrees of the filter 48 at the video carrier frequency of the lower immediately adjacent channel N−1 and at the sound carrier frequency of the upper immediately adjacent channel N+1 are respectively over 15 1 dB (see points A and B), the attenuation degrees of the same at the sound carrier frequency of the lower immediately adjacent channel N−1 and at the video carrier frequency of the upper immediately adjacent channel N+1 are respectively several dB (see points C and D).

Since some signals in the immediately adjacent channels N+1 and N−1 readily transmit through the band pass filter 48, these transmitted signals are apt to cause interferences in the following stages if no countermeasure is taken. However, in accordance with the present invention the combination of the intermediate frequency amplifier 51 and the following circuits 52 and 53 has the above-mentioned frequency response which is represented by the curve 191 so that interference-rejection characteristic is improved.

Figure 18:
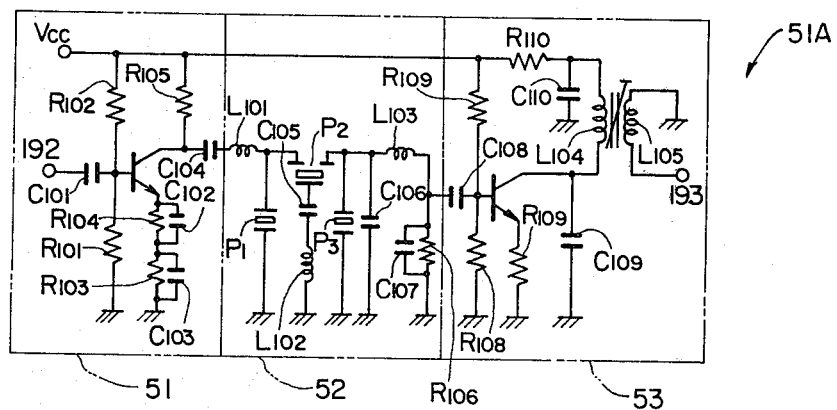
FIG. 18 is a schematic circuit diagram of the second intermediate frequency amplifying stage shown in FIG. 8.

FIG. 18 shows a circuit diagram of the above-mentioned second intermediate frequency amplifying stage 51A including the intermediate frequency amplifier 51, the band pass filter 52 and the output intermediate frequency amplifier 53. Reference numerals 192 and 193 respectively designate the input and output terminals of the amplifying stage 51A. The intermediate frequency amplifier 51 comprises a transistor the emitter of which is connected via an input coupling capacitor C101 to the input terminal 192. The collector of the transistor is connected via an output coupling capacitor C104 to an input of the following band pass filter 52, and is further connected via a resistor to a terminal connected to a power supply Vcc. A series circuit of resistors R101 and R102 constitutes a voltage divider between the power supply Vcc and ground, and a junction between these resistors R101 and R102 is connected to the base of the transistor for serving as a bias circuit.

A parallel circuit of a resistor R104 and a capacitor C102 is connected at its one end to the emitter of the transistor, and is further connected at the other end thereof via another parallel circuit of a resistor R103 and a capacitor C103 to ground. Namely, a parallel-series circuit of resistors R104 and R103 and capacitors C102 and C103 is interposed in the grounded-emitter circuit. This parallel-series circuit is utilized for obtaining low-noise and low-distortion characteristics.

The capacitor C102 connected across the resistor R103 is used for transmitting the intermediate frequency signal to ground. The capacitance and resistance of the capacitor C102 and resistor R104 are respectively selected so as to actualize the low-distortion characteristic without causing the low-noise characteristic of the intermediate frequency amplifier 51 to be deteriorated. In the preferred embodiment, the resistance of R104 is from 10 to 30 ohms, while the capacitance of the C102 is from 100 to 200 picofarads.

With the provision of the resistor R104 and the capacitor C102 the cross modulation distortion characteristic at the second intermediate frequency band is considerably improved. If the resistor R104 and the capacitor C102 were not added, namely if only the parallel circuit of the resistor R103 and the capacitor of C103 were interposed between the emitter and ground, the noise figure would be 2.0 dB, while the input level of adjacent channel signals, which give cross modulation distortion of 1 percent to the desired channel signal, would be $-30$ dBm.

In the embodiment of FIG. 18, however, the noise figure of the intermediate frequency amplifier 51 is below 2.5 dB, and the input level of adjacent channel signals, which give cross modulation distortion of 1 percent to the desired channel signal, is over $-20$ dBm owing to the provision of the resistor R104 and the capacitor C102.

The band pass filter 52 is fundamentally constructed of a ceramic filter $P_2$ and ceramic resonators $P_1$ and $P_3$. The ceramic filter $P_2$ is of one-resonator type, and a series circuit of a capacitor C105 and a coil L102 is connected to its ground terminal. The ceramic resonator $P_1$ functions as a trap filter at the sound carrier frequency, i.e. 60.25 MHz, of the lower immediately adjacent channel N$-$1. The ceramic resonator $P_3$ functions as a trap filter at the video carrier frequency, 52.75 Mhz, of the upper immediately adjacent channel. The attenuation degree of each trap is over 30 dB. Two coils L101 and L103 are used for effecting impedance matching at the input and output of the band pass filter 52.

The output intermediate frequency amplifier 53 comprises a tuning amplifier having a resonating circuit constructed of a capacitor C109 and a coil L104. The coil L104 is inductively coupling with a coil L105 in such a manner that the output impedance at 57 MHz band is 75 ohms.

With the provision of the combination of the second intermediate frequency amplifier 51, the band pass filter 52, and the output intermediate frequency amplifier 53 a noise figure of below 3 dB is obtained, while the input level of immediate adjacent channel signals, which give cross modulation distortion of 1 percent to the desired channel signal, is over $-20$ dBm.

Figure 19:
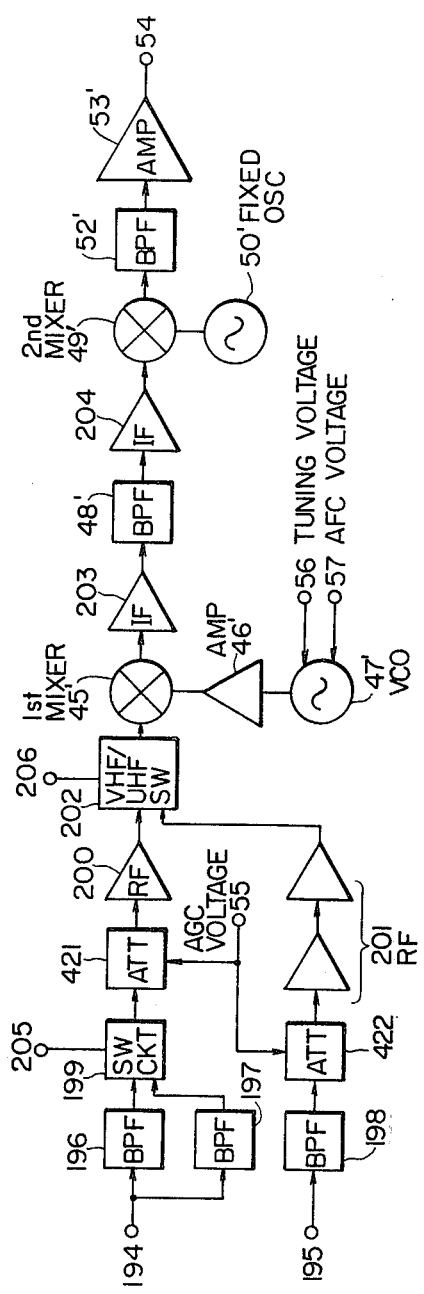
FIG. 19 is a schematic block diagram of a second embodiment of the VHF-UHF all-band tuner according to the present invention.

Reference is now made to FIG. 19 which shows a schematic block diagram of the second embodiment of the VHF-UHF all band tuner according to the present invention. The tuner of FIG. 19 is for receiving TV channel in the United States of America. The second embodiment has better characteristics with respect to two-channel beat interference, second harmonic interference and cross modulation interference than the first embodiment of FIG. 8. Elements and circuits which are the same as those in FIG. 8 are designated at like numerals, whereas elements and circuits whose set frequency differs from those in FIG. 8 are designated at like numerals which are apostrophized.

Reference numerals 194 and 195 respectively designate a VHF input terminal and a UHF input terminal. A band pass filter 196 for VHF lower channels having a band from 50 to 90 MHz and a band pass filter 197 for VHF higher channels having a band from 170 to 220 MHz are respectively connected to the VHF input terminal 194. The output terminals of the band pass filters 196 and 197 are connected to input terminals of a switching circuit 199. The switching circuit 199 selectively transmits one of the output signals of the band pass filters 196 and 197 in accordance with a control voltage applied to a terminal 205 where the control voltage is variable to a desired channel. The output of the switching circuit 199 is connected to an input terminal of a variable attenuator 421 which is constructed of a pin diode. The insertion loss of each of the band pass filters 196 and 197 and the switching circuit 199 is below 1 dB. The variable attenuator is the same in construction as that of the first embodiment, and the loss at the transmission band is below 1 dB while the maximum attenuation degree is 50 dB. The output signal of the variable attenuator 421 is applied to a radio frequency (RF) amplifier 200 of the VHF band. The RF amplifier 200 is a single-transistor stage amplifier having a gain of 15 dB and a noise figure below 2.5 dB at a band from 50 to 250 MHz. The input level of the immediately adjacent channels and second adjacent channels, which give cross modulation distortion of 1 percent to the desired channel signal, is below approximately $-15$ dBm.

A band pass filter 198 for the UHF band is connected to the UHF input terminal 195 where the band pass filter 198 has a band from 450 to 900 MHz. The output terminal of the band pass filter 198 is connected to a variable attenuator 422 which is constructed of a pin diode. The loss at the UHF transmission band of the variable attenuator 422 is below 1.5 dB while the maximum attenuation degree is 45 dB. The output signal of the variable attenuator 422 is applied to an input terminal of an RF amplifier 201 of UHF band having two transistor amplifying stages. The RF amplifier 201 has a gain of 15 dB and a noise figure below 3.5 dB at a band from 400 to 1000 MHz, and the input level of immediately adjacent channels and second adjacent channels, which give cross modulation distortion of 1 percent to the desired channel signal, is below approximately −15 dBm. Both the output terminals of the VHF RF amplifier 200 and the UHF RF amplifier 201 are respectively connected to input terminals of a VHF/UHF switching circuit 202 which is responsive to a control voltage applied to a terminal 206. Namely, the VHF/UHF switching circuit 202 selectively transmits one of the output signals of the RF amplifiers 200 and 201 to a following first mixing circuit 45' which is constructed of a diode single balanced mixer. The first mixing circuit 45' has a second input terminal for receiving a local oscillator signal which is generated by a voltage controlled oscillator 47' and is amplified by an amplifier 46' in the same manner as in the first embodiment.

Assuming that a frequency of 2700 MHz is selected as the first intermediate frequency, which does not give interference to the desired channel signals in the United States of America, and the first intermediate frequency equals the difference between the oscillating frequency of the voltage controlled oscillator 47' and the desired channel signal frequency, the necessary oscillating frequency band of the voltage controlled oscillator 47' is from 2757 to 3587 MHz.

The first mixing circuit 45', the voltage controlled oscillator 47' and the amplifier 46' are substantially the same in construction as those in the first embodiment where only the set frequency are slightly different from those in the first embodiment. The output signal of the first mixing circuit 45' is applied to a first amplifier 203 for the first intermediate frequency, which amplifier 203 is of single-transistor stage type. The first amplifier 203 has a gain of 6 dB and a noise figure below 3.5 dB at 2700 MHz, and the input level of immediately adjacent channel signals and second adjacent channel signals, which give cross modulation distortion of 1 percent to the desired channel signal, is approximately −8 dBm.

The output signal of the first amplifier 203 for the first intermediate frequency is applied to a fixed frequency band pass filter 48' of coaxial type having a band width of 5 MHz and a center frequency of 2700 MHz. The insertion loss of the band pass filter 48' at the center frequency is approximately 5 dB. The output signal of the frequency fixed band pass filter 48' is applied to a second amplifier 204 for the first intermediate frequency. The second amplifier 204 is of single-transistor stage, and has a gain of 6 dB and a noise figure over 3.0 dB at 2700 MHz. The output signal of the second amplifier 204 is applied to a first input terminal of a second mixing circuit 49' having second input terminal for receiving a local oscillator frequency signal of 2655 MHz generated by a fixed frequency oscillator 50'. The output signal of the second mixing circuit 49' is applied to a combination 52' of a frequency fixed band pass filter and a trap circuit for selectively transmitting the second intermediate frequency signal of 45 MHz. The circuit 52' is the same in construction as the circuit 52 of the first embodiment whereas the set frequency differs. The output signal of the filter circuit 52' is applied to an amplifier 53' of output tuning type to be amplified to a given level. The gain of the amplifier 53' is 25 dB.

Terminals 55, 56 and 57 for respectively receiving an AGC voltage, a tuning voltage, and an AFC voltage are provided in the same manner as in the first embodiment. Since the operations of AGC, tuning and AFC are the same as in the first embodiment, description thereof is omitted.

In the above-described second embodiment, since the first and second amplifiers 203 and 204 of low gain, low distortion and low noise type for the first intermediate frequency are respectively coupled to the input and output sides of the fixed frequency band pass filter 48', it is possible to lower the gain of the RF amplifiers 200 and 201 without deteriorating the total noise characteristics of the whole tuner. Accordingly, the amplifying gain between the input terminal 194 or 195 and the first input terminal of the first mixing circuit 45' can be reduced compared to the first embodiment so that the characteristics against cross modulation interference and inter-third harmonic interference in the whole tuner is improved when compared to the first embodiment. In accordance with the second embodiment the total noise figure of the tuner is approximately 5.5 dB at the VHF band, and is approximately 7 dB at the UHF band, while the input level of the immediately adjacent channel signals and the second adjacent channel signals, which give cross modulation distortion of 1 percent to the desired channel signal, is from −15 to 20 dBm.

Furthermore, with the provision of the band pass filters 196, 197 and 198 for VHF lower channels, VHF higher channels and UHF channels at the input side of each of the RF amplifiers 200 and 201, signals other than the desired channel singnal are attenuated before applied to the RF amplifier 200 or 201 so that the second harmonic interference rejection characteristic is improved. In addition, two-channel beat interference, which occurs when signals of two channels other than the desired channel are used to make the sum thereof and/or the difference therebetween to fall in the desired channel, is reduced.

As described hereinbefore, assuming that 2700 MHz is selected as the first intermediate frequency for receiving U.S. TV channels, and when the first intermediate frequency is obtained from the difference between the local oscillator frequency applied to the first mixing circuit 45' and the desired channel signal frequency, the spurious interferences which fall in the first intermediate frequency band are the second and third harmonic interferences which occur in the RF amplifier 200 or 201 and in the first mixing circuit 45', and beat interferences between channels. The rejection characteristic against these interferences has been remarkably improved in the second embodiment to the utmost.

Furthermore, in the second embodiment, the image frequency suppression characteristic in the VHF band, which image frequency occurs in the second mixing circuit 45', is over 85 dB because the image frequency is out of the bands of the band pass filters 196 and 197 for VHF lower channels and for VHF upper channels, also because of the provision of the frequency fixed filter 48'.

From the foregoing, it will be understood that the present invention provides a useful mixing circuit and VHF-UHF all band tuner having the mixing circuit. The above-described embodiment are just examples and therefore, many variations and modifications may be made without departing from the spirit of the present invention.

What is claimed is:

1. A VHF-UHF all-band tuner of the double superheterodyne type including a first mixing circuit for converting an incoming signal frequency into a first intermediate frequency by mixing said incoming signal with a first local oscillator signal whose frequency is variable, a filter circuit for selectively receiving said first intermediate frequency signal, and a second mixing circuit responsive to the output signal of said filter circuit and to a second local oscillator signal whose frequency is fixed, for converting said first intermediate frequency into a second intermediate frequency; characterized in that said first local oscillator frequency is higher than said first intermediate frequency, and in that said first intermediate frequency lies in a band of 2520 to 2700 MHz.

2. A VHF-UHF all-band tuner as claimed in claim 1, wherein said first mixing circuit comprises a diode balanced mixer made in the form of a microwave integrated circuit.

3. A VHF-UHF all-band tuner as claimed in claim 2, wherein said diode balanced mixer comprises a balance-to unbalance transformer having first and second coupling lines which constitute parallel coupled lines, an open-ended stub connected to one end of said first coupling line, a line connected to the other end of said first coupling line for receiving said first local oscillator signal; and a ground line connected between said second coupling line at a substantially midway point of said second coupling line, and ground.

4. A VHF-UHF all-band tuner as claimed in claim 3, wherein said diode balanced mixer comprises first and second open-ended output lines respectively connected to both ends of said second coupling line; a terminal for receiving said incoming signal and for deriving said first intermediate frequency signal, said terminal being placed separately from said first and second open-ended output lines at a substantially midway point between said first and second open-ended output lines; a first series circuit, interposed between said first output line and said terminal, of a first resistor and a first mixing diode; a second series circuit, interposed between said second output line and said terminal, of a second resistor and second mixing diode; and first and second capacitors respectively connected across said first and second resistors.

5. A VHF-UHF all-band tuner as claimed in claim 4, further comprising a diplexer having a high pass filter connected to said terminal for receiving said incoming signal, and a low pass filter connected to said terminal for deriving said first intermediate frequency signal.

6. A VHF-UHF all-band tuber as claimed in claim 1, wherein said filter circuit has a band width of 3 to 5 MHz.

7. A VHF-UHF all-band tuner as claimed in claim 1, wherein said filter circuit comprises shielding plates respectively placed between resonators, each of said shielding plates having a coupling through-hole.

8. a VHF-UHF all-band tuner as claimed in claim 1, wherein said first local oscillator comprises a single tuning varactor by which the oscillating frequency is variable throughout an entire band corresponding to all channels of VHF to UHF bands.

9. A VHF-UHF all-band tuner as claimed in claim 8, wherein said first local oscillator comprises a voltage controlled oscillator having a resonator portion, oscillating circuit portion and an inter-digital capacitor made in the form of a microwave integrated circuit, said capacitor being placed between said resonator portion and said oscillating circuit portion for effecting coupling.

10. A VHF-UHF all-band tuner as claimed in claim 9, wherein said resonator comprises a substantially U-shaped stripline.

11. A VHF-UHF all-band tuner as claimed in claim 1, further comprising an AFC circuit in which an AFC control voltage is superimposed on a tuning voltage to produce a resultant voltage which is applied to said first local oscillator to change the oscillating frequency thereof.

12. A VHF-UHF all-band tuner as claimed in claim 9, further comprising an AFC circuit connected to said resonator portion, said AFC circuit having a varactor, the capacitance of which is variable in accordance with an AFC voltage.

13. A VHF-UHF all band tuner as claimed in claim 12, wherein said resonator portion comprises a stripline connected as its one end to said inter-digital capacitor, said AFC circuit being connected to said stripline close to said inter-digital capacitor.

14. A VHF-UHF all-band tuner as claimed in claim 13, wherein said AFC circuit comprises a series circuit of a resistor and a first capacitor interposed between a terminal for receiving an AFC voltage and said stripline; said varactor connected between a junction connecting said resistor and said first capacitor, and ground; and a second capacitor connected between said terminal and ground.

15. A VHF-UHF all-band tuner as claimed in claim 1, wherein said second local oscillator comprises a half wave resonator equipped with a loading capacitor, said half resonator being constructed to a microwave integrated circuit.

16. A VHF-UHF all-band tuner as claimed in claim 15, wherein said half wave resonator is connected to an oscillating circuit of second local oscillator at a substantially midway point of said stripline constituting said resonator.

17. A VHF-UHF all-band tuner as claimed in claim 1, wherein said second mixing circuit comprises a diode balanced mixer made in the form of a microwave integrated circuit.

18. A VHF-UHF all-band tuner as claimed in claim 17, wherein said diode balanced mixer comprises a balance-to-unbalance transformer having first and second coupling lines which constitute parallel coupled lines; an open-ended stub connected to one end of said first coupling line; a line connected to the other end of said first coupling line for receiving said second local oscillator signal; a ground line connected between said second coupling line at a substantially midway point of said second coupling line, and ground; and a short-circuit line connected between said first and second coupling lines.

19. A VHF-UHF all-band tuner as claimed in claim 18, wherein said diode balanced mixer comprises first and second open-ended output lines respectively connected to both ends of said second coupling line; a terminal for receiving said first intermediate frequency signal and for deriving said second intermediate frequency signal, said terminal being placed separately from said first and second open-ended output lines at a substantially midway point between said first and second open-ended output lines; and first and second mixing diodes respectively interposed between said first open-ended output line and said terminal, and between said second open-ended output line and said terminal.

20. A VHF-UHF all-band tuner as claimed in claim 19, further comprising a diplexer having a band pass filter connected to said terminal for receiving said first intermediate frequency signal; and a low pass filter connected to said terminal for deriving said second intermediate frequency signal.

21. A VHF-UHF all-band tuner as claimed in claim 1, further comprising a second intermediate frequency amplifying stage having a second intermediate frequency amplifier and a band pass filter for selectively transmitting the second intermediate frequency from said second intermediate frequency amplifier.

22. A VHF-UHF all-band tuner as claimed in claim 21, further comprising a trap filter connected to said second intermediate frequency amplifier for attenuating a given frequency signal.

23. A VHF-UHF all-band tuner as claimed in claim 1, further comprising a low gain amplifier connected to the input side of said filter circuit.

24. A VHF-UHF all-band tuner as claimed in claim 1, further comprising an amplifier connected to the output side of said filter circuit.

25. A VHF-UHF all-band tuner as claimed in claim 1, further comprising two amplifiers respectively connected to the input and output sides of said filter circuit.

26. A VHF-UHF all-band tuner comprising:
(a) an input filter circuit responsive to an incoming or received signal, said input filter circuit having a trap circuit and a high pass filter for attenuating signals of the intermediate frequency and its half frequency of a TV set connected to said tuner;
(b) a variable attenuator responsive to the output signal of said filter circuit for attenuating the same in accordance with an AGC voltage;
(c) a radio frequency amplifier responsive to the output signal of said variable attenuator for amplifying the same to a given level;
(d) a voltage controlled oscillator for producing a first local oscillator signal whose frequency is variable in accordance with a tuning voltage and with an AGC voltage respectively applied thereto;
(e) a local oscillator signal amplifier responsive to the output signal of said voltage controlled oscillator for amplifying the same to a given level;
(f) a first mixing circuit responsive to the output signal of said radio frequency amplifier and to said local oscillator signal amplifier for converting the frequency of said incoming signal into a first intermediate frequency residing in a band ranging from 2520 to 2700 MHz by subtracting said incoming signal frequency from said first local oscillator frequency;
(g) a fixed frequency band pass filter for transmitting said first intermediate frequency signal from said first mixing circuit;
(h) a fixed frequency local oscillator for producing a second local oscillator signal whose frequency is constant;
(i) a second mixing circuit responsive to the output signal of said fixed frequency band pass filter and to said second local oscillator signal for converting said first intermediate frequency into a second intermediate frequency; and
(j) a second intermediate frequency amplifying stage responsive to said second intermediate frequency signal from said second mixing circuit, said second intermediate frequency amplifying stage having an intermediate frequency amplifier, a filter circuit constructed of a band pass filter and a trap circuit for attenuating the video carrier signal component of the upper immediately adjacent channel and the sound carrier signal component of the lower immediately adjacent channel both included in the output signal of said intermediate frequency amplifier, and an output intermediate frequency amplifier responsive to the output signal of said filter circuit.

27. A VHF-UHF all-band tuner comprising:
(a) a first input band pass filter responsive to an incoming or received signal of VHF lower channels;
(b) a second input band pass filter responsive to an incoming or received signal of VHF higher channels;
(c) a switching circuit for transmitting one of the output signals of said first and second input filters in accordance with a control voltage determined by a desired channel;
(d) a first variable attenuator responsive to the output signal of said switching circuit for attenuating the same in accordance with an AGC voltage;
(e) a first radio frequency amplifier responsive to the output signal of said variable attenuator for amplifying the same to a given level;
(f) a third input band pass filter responsive to an incoming signal of UHF channels;
(g) a second variable attenuator responsive to the output signal of said third input band pass filter for attenuating the same in accordance with said AGC voltage;
(h) a second radio frequency amplifier responsive to the output signal of said second variable attenuator for amplifying the same to a given level;
(i) a VHF/UHF switching circuit for transmitting one of the output signals of said first and second radio frequency amplifiers in accordance with a control voltage determined by a desired channel;
(j) a voltage controlled oscillator for producing a first local oscillator signal whose frequency is variable in accordance with a tuning voltage and with an AFC voltage respectively applied thereto;
(k) a local oscillator signal amplifier responsive to the output signal of said voltage controlled oscillator for amplifying the same to a given level;
(l) a first mixing circuit responsive to the output signal of said VHF/UHF switching circuit and to said local oscillator signal amplifier for converting the frequency of said incoming signal into a first intermediate frequency residing in a band from 2520 to 2700 MHz by subtracting said incoming signal frequency from said first local oscillator frequency;
(m) a first intermediate frequency amplifying stage for amplifying said first intermediate frequency signal from said first mixing circuit, said first intermediate frequency amplifying stage having a first amplifier of low gain; a band pass filter responsive to the output signal of said first amplifier; and a second amplifier of low gain responsive to the output signal of said band pass filter;
(n) a fixed frequently local oscillator for producing a second local oscillator signal whose frequency is constant;
(o) a second mixing circuit responsive to the output signal of said fixed frequency band pass filter and to said second local oscillator signal for converting said first intermediate frequency into a second intermediate frequency; and
(p) a second intermediate frequency amplifying stage responsive to said second intermediate frequency signal from said second mixing circuit, said second intermediate frequency amplifying stage having a filter circuit constructed of a fixed frequency band pass filter and a trap circuit, and an amplifier.

28. A microwave mixing circuit comprising:
(a) a parallel coupled lines having first and second lines;
(b) an open-ended stub connected to one end of said first line;
(c) a first terminal connected to the other end of said first line, for receiving a local oscillator signal;
(d) a pair of mixing diodes connected in series between both ends of said second line;
(e) a ground line connected between said second line at its substantially midway point and ground;
(f) a second terminal connected between said pair of diodes for receiving an input signal whose frequency is to be converted, and for deriving an intermediate frequency signal; and
(g) a short-circuit line connected between said first and second lines.

29. A microwave mixing circuit as claimed in claim 28, further comprising a diplexer having a band pass filter through which said input signal is applied to said second terminal, and a low pass filter through which said intermediate frequency signal is derived from said second terminal.

* * * * *